US009406805B2

(12) United States Patent
Tsai et al.

(10) Patent No.: US 9,406,805 B2
(45) Date of Patent: Aug. 2, 2016

(54) FIN-FET

(71) Applicant: UNITED MICROELECTRONICS CORP., Hsin-Chu (TW)

(72) Inventors: Chen-Hua Tsai, Hsinchu County (TW); Rai-Min Huang, Taipei (TW); Sheng-Huei Dai, Taitung County (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/749,648

(22) Filed: Jun. 25, 2015

(65) Prior Publication Data

US 2015/0295090 A1  Oct. 15, 2015

Related U.S. Application Data

(62) Division of application No. 13/211,334, filed on Aug. 17, 2011, now Pat. No. 9,105,660.

(51) Int. Cl.
H01L 29/78 (2006.01)
H01L 29/66 (2006.01)
H01L 29/10 (2006.01)
H01L 29/16 (2006.01)
H01L 21/02 (2006.01)
H01L 21/20 (2006.01)

(52) U.S. Cl.
CPC ........ H01L 29/7853 (2013.01); H01L 29/1054 (2013.01); H01L 29/16 (2013.01); H01L 29/66795 (2013.01); H01L 29/785 (2013.01); H01L 29/7842 (2013.01); H01L 21/02647 (2013.01); H01L 21/2022 (2013.01); H01L 2029/7858 (2013.01)

(58) Field of Classification Search
CPC ............... H01L 21/823431; H01L 21/823821; H01L 27/0886; H01L 27/0924; H01L 27/10826; H01L 27/10876; H01L 27/1211; H01L 29/41791; H01L 29/66772; H01L 29/6678; H01L 29/66795; H01L 29/7831; H01L 29/7832; H01L 29/785
See application file for complete search history.

(56) References Cited

U.S. PATENT DOCUMENTS 6,043,138 A    3/2000  Ibok
6,492,216 B1  12/2002  Yeo (Continued)

FOREIGN PATENT DOCUMENTS

CN   101154597 A    4/2008
TW   200805651     1/2008
TW   I321830       3/2010

OTHER PUBLICATIONS

Tsu-Jae King Liu, "Ondule Semiconductor Technical Overview", Sep. 2010.

(Continued)

Primary Examiner — Julio J Maldonado
Assistant Examiner — Leslie Pilar Cruz
(74) Attorney, Agent, or Firm — Winston Hsu; Scott Margo

(57) ABSTRACT

A Fin-FET and a method of forming the Fin-FET are provided. A substrate is provided, and then a mask layer is formed thereabove. A first trench is formed in the substrate and the mask layer. A semiconductor layer is formed in the first trench. Next, the mask layer is removed such that the semi-conductive layer becomes a fin structure embedded in the substrate and protruded above the substrate. Finally, a gate layer is formed on the fin structure.

5 Claims, 7 Drawing Sheets

(56) References Cited

U.S. PATENT DOCUMENTS

| | | |
|---|---|---|
| 6,921,963 B2 | 7/2005 | Krivokapic |
| 7,087,477 B2 | 8/2006 | Fried |
| 7,091,551 B1 | 8/2006 | Anderson |
| 7,247,887 B2 | 7/2007 | King |
| 7,250,658 B2 | 7/2007 | Doris |
| 7,265,008 B2 | 9/2007 | King |
| 7,309,626 B2 | 12/2007 | Ieong |
| 7,352,034 B2 | 4/2008 | Booth, Jr. |
| 7,470,570 B2 | 12/2008 | Beintner |
| 7,508,031 B2 | 3/2009 | Liu |
| 7,528,465 B2 | 5/2009 | King |
| 7,531,437 B2 | 5/2009 | Brask |
| 7,569,857 B2 | 8/2009 | Simon |
| 7,605,449 B2 | 10/2009 | Liu |
| 2004/0195624 A1 | 10/2004 | Liu |
| 2005/0051825 A1 | 3/2005 | Fujiwara |
| 2006/0099830 A1 | 5/2006 | Walther |
| 2006/0286729 A1 | 12/2006 | Kavalieros |
| 2006/0292719 A1* | 12/2006 | Lochtefeld ........ H01L 21/02381 438/22 |
| 2007/0045748 A1 | 3/2007 | Booth |
| 2007/0108528 A1 | 5/2007 | Anderson |
| 2007/0158756 A1 | 7/2007 | Dreeskornfeld |
| 2007/0218654 A1 | 9/2007 | Spencer |
| 2007/0262375 A1 | 11/2007 | Juengling |
| 2007/0262389 A1 | 11/2007 | Chau |
| 2008/0006908 A1 | 1/2008 | Lin |
| 2008/0073667 A1* | 3/2008 | Lochtefeld ........ H01L 29/66795 257/190 |
| 2008/0081420 A1 | 4/2008 | Kim |
| 2008/0157182 A1 | 7/2008 | Song |
| 2008/0157208 A1 | 7/2008 | Fischer |
| 2009/0090976 A1 | 4/2009 | Kavalieros |
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2011/0049568 A1 | 3/2011 | Lochtefeld |

OTHER PUBLICATIONS

Dai, Title of Invention: Method of Forming Non-planar FET, U.S. Appl. No. 13/218,438, filed Aug. 25, 2011.

* cited by examiner

FIN-FET

CROSS REFERENCE TO RELATED APPLICATIONS

This application is a Divisional of application Ser. No. 13/211,334 filed Aug. 17, 2011, and included herein by reference.

BACKGROUND OF THE INVENTION

1. Field of the Invention

The present invention relates to a Fin-FET, and more particularly, to a Fin-FET having an embedded fin structure.

2. Description of the Prior Art

In recent years, as various kinds of consumer electronic products are being constantly modified towards miniaturization development, the size of semiconductor components are modified to be reduced accordingly, in order to meet high integration, high performance, low power consumption, and the demand of products.

However, with the miniaturization development of the electronic products, current planar transistors no longer meet the requirements of the products. Thus, there is a development for non-planar transistor such as fin field effect transistors (Fin-FET) to achieve a high drive current and to lessen short channel effect. Because the Fin-FET basically has a three-dimensional structure, the forming method thereof is more complicated than that of the traditional structure. Generally, the Fin-FET is formed on a silicon-on-insulator (SOI) substrate. There are still some problems needing to be overcome when forming the Fin-FET on traditional bulk-silicon substrate.

Therefore, there is still a need for a novel method of manufacturing a Fin-FET device.

SUMMARY OF THE INVENTION

The present invention therefore provides a Fin-FET and a method of making the same. The method can be applicable to a traditional silicon substrate and the yields of the product can be improved.

According to one embodiment, a method of forming a Fin-FET is provided in the present invention. A substrate is provided, and then a mask layer is formed thereabove. A first trench is formed in the substrate and the mask layer. A semiconductor layer is formed in the first trench. Next, the mask layer is removed such that the semi-conductive layer becomes a fin structure embedded in the substrate and protruded above the substrate. Finally, a gate layer is formed on the fin structure.

According to another embodiment, a Fin-FET is provided. The Fin-FET includes a substrate, a fin structure, a gate dielectric layer and a gate layer. The fin structure is embedded in the substrate and protruding above the substrate. The gate dielectric layer disposed on a surface of the fin structure. The gate layer is disposed on the gate dielectric layer.

By using the selective epitaxial growth process to form the fin structure, in combination of the tapered sidewall and the CTA process, the quality of the fin structure can be enhanced, so the yields of the products can be improved. Moreover, in comparison with traditional Fin-FET which is mostly formed on SOI substrate, the forming method can be applicable to silicon substrate, thereby increasing the flexibility of forming methods.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 12:
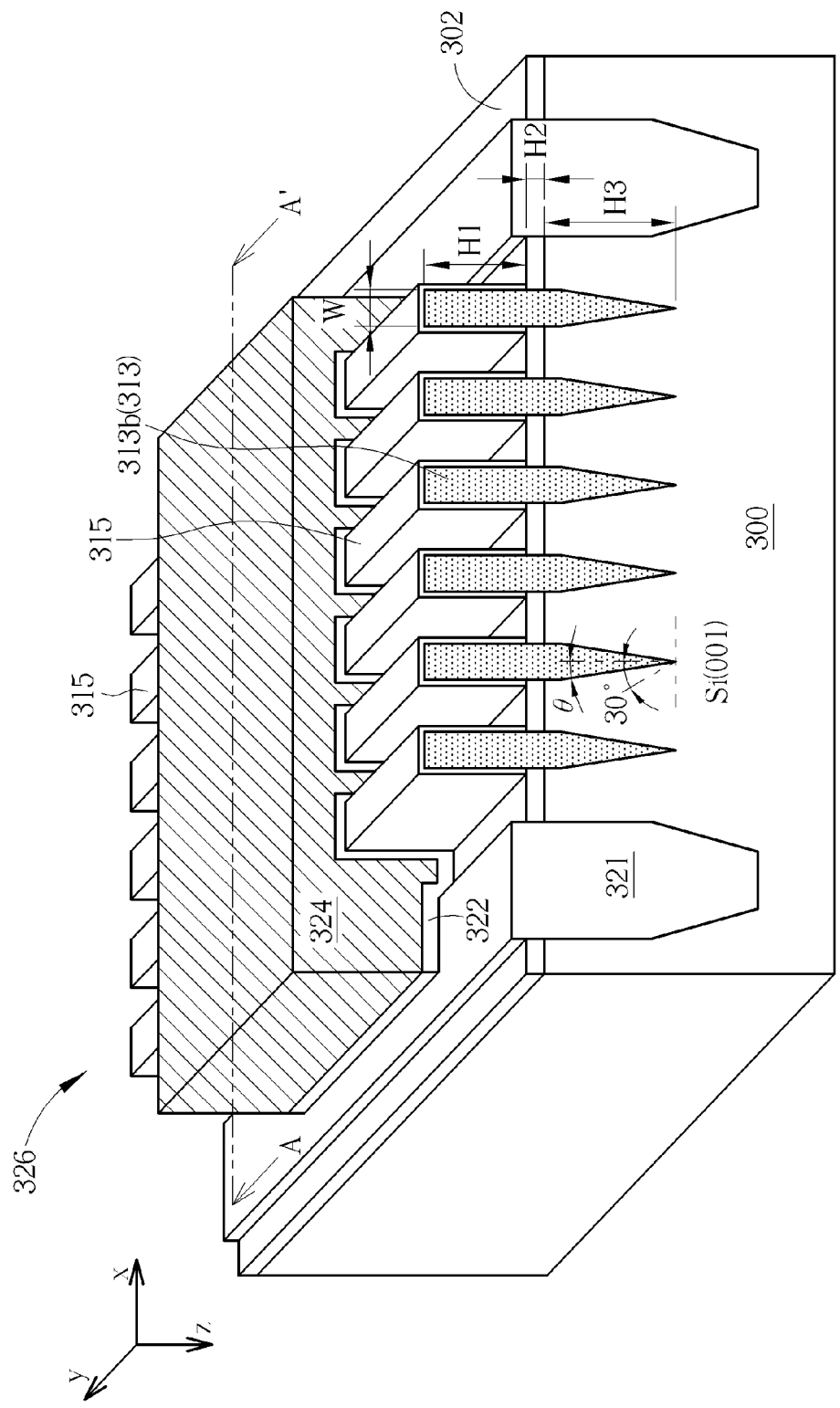
FIG. 12 illustrates a schematic diagram of the Fin-FIN in the present invention.

First, please refer to FIG. 12, illustrating a schematic diagram of the Fin-FIN in the present invention. As shown in FIG. 12, the Fin-FET 326 in the present invention is disposed in an active region surrounded by a shallow trench isolation 321. The Fin-FET 326 includes a substrate 300, at least a fin structure 313, a material layer 302, a gate dielectric layer 322 and a gate layer 324. The substrate 300 may be a bulk silicon substrate, a germanium substrate or an SOI substrate. The material layer 302 is disposed on the substrate 300. In one preferred embodiment of the present invention, the material layer 302 includes silicon dioxide ($SiO_2$).

The fin structure 313 is embedded in the substrate 300, and protrudes from the substrate 300 through the material layer 302. Each fin structure 313 extends along the y direction and is parallel to each other along the x direction. As shown in FIG. 12, each fin structure 313 has a width W, a thickness H1 protruding from the material layer 302, a thickness H2 through the material layer 302, and a thickness H3 embedded in the substrate 300. In one preferred embodiment of the present invention, the width W is substantially between 100 angstroms (A) and 200 A, the thickness H1 substantially greater than twice of the width W, the thickness H2, depending on the design of device, can be substantially about 0.5 the width W, or can be 0.5~2 W, or can be greater than or equal to the width W, and the thickness H3 is substantially between 100 A and 500 A. In addition, the fin structure 313 in the present invention includes a tapered structure shrinking toward the substrate 300. Preferably, the angle θ of the tapered structure is less than 30 degrees. The fin structure 313, for example, can be a silicon layer, a germanium layer, a silicon-germanium layer or the combination thereof. The fin structure 313 may further include a source region 313a and a drain region 313b, which are separated by the gate layer 324 and are formed by an implanting process with appropriate concentration and electrical properties of dopants.

The gate layer 324 is disposed on the gate dielectric layer 322 and extends along the x direction to cover at least one fin structure 313. The gate layer 324 can include a variety of conductive materials, such as polysilicon or metal. The gate dielectric layer 322 is disposed between the gate layer 324 and the fin structure 313 and covers a surface of the fin structure 313. Specifically, the gate dielectric layer 322 is disposed on a sidewall and/or a top surface of the portions of the fin structure 313 protruding from the substrate 300 (that is, the portion of fin structure 313 having a thickness H1). The gate dielectric layer 322 can be, for example, a silicon layer or a high-k dielectric layer. The high-k dielectric layer can be selected from a group consisting of, for example, hafnium oxide ($HfO_2$), hafnium silicon oxide ($HfSiO_4$), hafnium silicon oxynitride (HfSiON), aluminum oxide ($Al_2O_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT) and barium strontium titanate (Ba$_x$Sr$_{1-x}$TiO$_3$, BST).

It is understood that the x direction, y direction and z direction mentioned above only provide reference of relative positions. The substrate 300 may be rotated 90 degree clockwise or counterclockwise. For example, the fin structure 313 can extend along the x direction and is parallel to each other along the y direction and the gate layer 324 can extend along the y direction. The arrangement is variation and moderation of this invention and should be also within the scope of this invention.

In order to enhance the electrical performance of the Fin-FET 326, the invention further provides various embodiments shown below. In one embodiment of the present invention, the Fin-FET 326 further includes a strained silicon layer 315 disposed between the fin structure 313 and the gate dielectric layer 322. For example, the strained silicon layer 315 can be disposed on the top surface and/or the sidewall of the fin structure 313. In another embodiment, if the fin structure 313 includes a relaxed SiGe layer, a second SiGe layer (not shown) can be disposed between the fin structure 313 and the gate dielectric layer 322, wherein a concentration of Ge in the second SiGe layer is greater than that in the fin structure 313.

Figure 1:
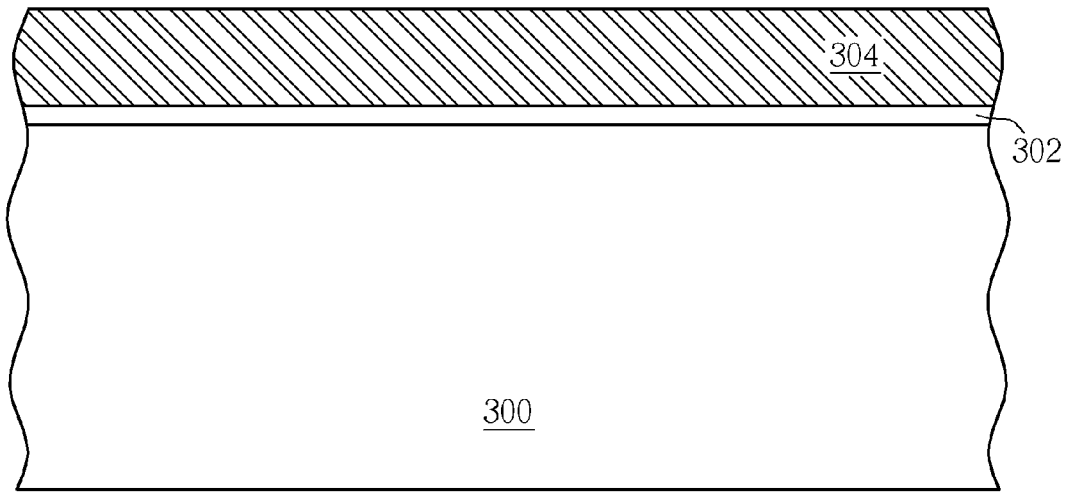
FIG. 1 to FIG. 11 illustrate schematic diagrams of the method of making the Fin-FET in the present invention.

Please refer to FIG. 1 to FIG. 11, illustrating schematic diagrams of the method of making the Fin-FET in the present invention, wherein FIG. 1 to FIG. 11 are illustrated according to the cross-sectional view taken along line AA' in FIG. 12. As shown in FIG. 1, a substrate 300 such as a silicon substrate is provided. Then, a material layer 302 and a mask layer 304 are formed on the substrate 300 in series. In one preferred embodiment of the present invention, the material layer 302 includes SiO2 and the mask layer 304 includes SiN.

Figure 2:
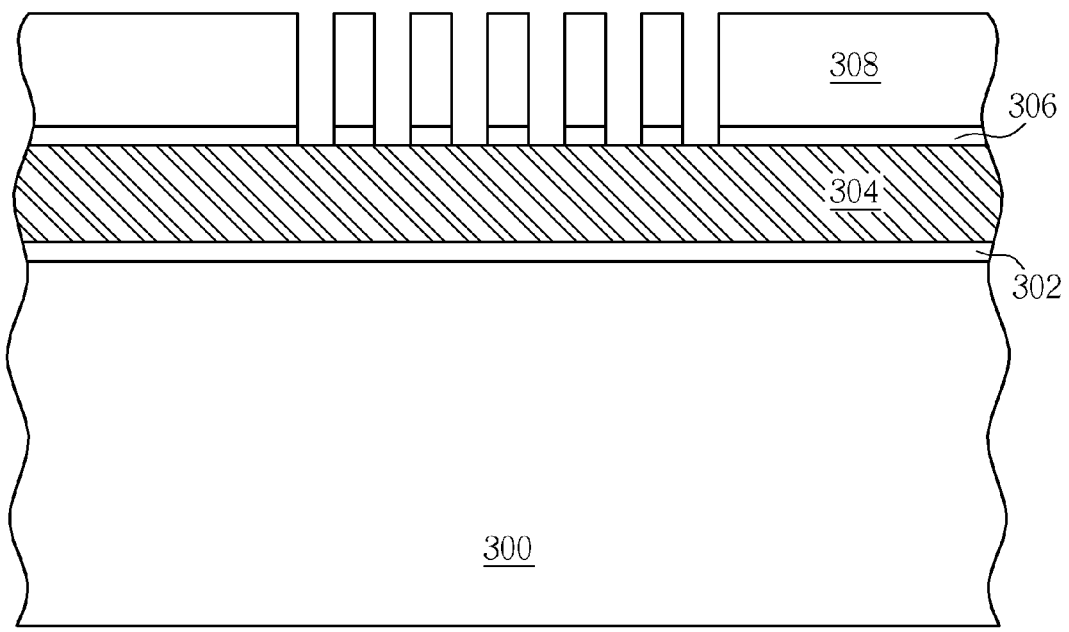

As shown in FIG. 2, a patterned photoresist layer 308 is formed on the mask layer 304 to define the position of the fin structures 313. In one preferred embodiment, one or more than one bottom-anti-reflection-coating (BARC) 306 can be selectively formed between the patterned photoresist layer 308 and the mask layer 304.

Figure 3:
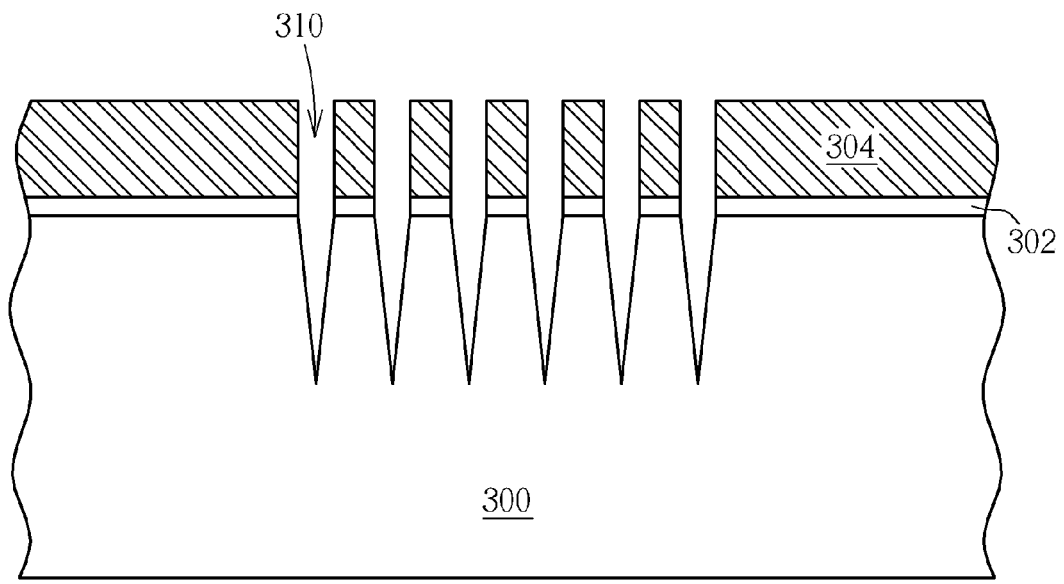

As shown in FIG. 3, at least one etching process is performed by using the patterned photoresist layer 308 as a mask. During the etching process, the mask layer 304, the material layer 302 and the substrate 300 not covered by the patterned photoresist layer 308 are removed away, thereby forming a plurality of first trenches 310. In one preferred embodiment of the present invention, the first trenches 310 include tapered sidewalls shrinking towards the substrate 300. The tapered angle is much less than 30 degrees. Next, the patterned photoresist layer 308 and the BARC 308 are removed away.

Figure 4:
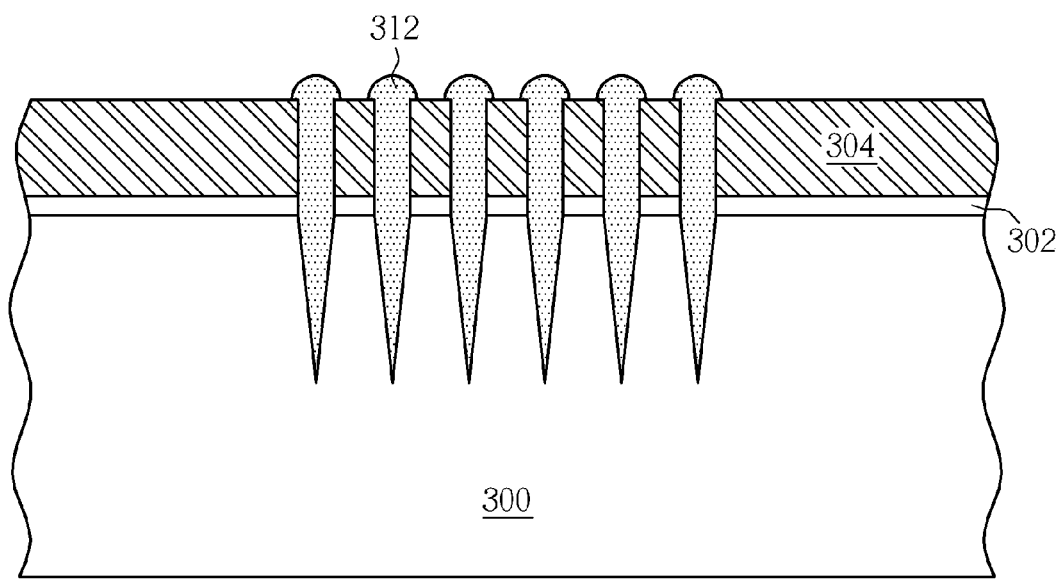

As shown in FIG. 4, a selective epitaxial growth process is performed by using the substrate 300 as a seed layer, thereby forming a semiconductor layer 312 in each of the first trench 310. The semiconductor layer 312 is grown from the bottom of the first trench 310 and further grown above the top surface of the mask layer 304. In one embodiment of the present invention, the semiconductor layer 312 includes silicon, germanium, silicon-germanium, or the combination thereof. The semiconductor layer 312 may include a single-layered structure or a multi-layered structure with appropriate stress. In general, if the substrate 300 is Si and the semiconductor layer 312 is Ge or SiGe, the dislocation usually occurs at the position about 30 degrees relative to the Si (001). For example, in FIG. 12, the Si (001) surface is parallel to the surface of the Si substrate 300 (the x direction), the tapered angle θ is thus positioned between the tapered sidewall and the z axis. Since the first trench 310 has a tapered sidewall and the tapered angle is much less than 30 degrees, when performing the selective epitaxial growth process, the dislocation of the semiconductor layer 312 or other lattice defects would glide upwardly along the tapered sidewall of the first trench 310. When meeting the sidewall of material layer 302 containing SiO2, the dislocations will be trapped thereto through an aspect ratio trapping (ART) mechanism. Therefore, the semiconductor layer 312 in the present invention can be free of dislocations and thus has better quality. It is noted that, although the position of the dislocation would change as the materials of the substrate 300 and the semiconductor layer 312 change, however, since the materials of the substrate 300 and the semiconductor layer 312 usually include diamond structure, the dislocation is still easy to occur at the position about 30 degrees relative to the Si (001). Thus, most of the dislocation defects can be prevented by using the tapered sidewalls set forth in the present invention.

In another embodiment of the present invention, after performing the selective epitaxial growth, a cyclic thermal annealing (CTA) process can be carried out. The CTA process may include a high temperature annealing step, and then a low-temperature annealing step over several cycles. In one preferred embodiment, the high temperature annealing step is held under 850 to 900 degrees Celsius, preferably 900 degrees Celsius, for 5 minutes and the low temperature annealing step is held under 350 to 450 degrees Celsius, preferably 400 degrees Celsius for 5 minutes, and a lot of cycles (for example, 3 cycles) are performed. Due to the difference of the thermal expansion coefficient between the semiconductor layer 312 and the substrate 300, the CTA process can promote the dislocations of the semiconductor layer 312 moving toward the material layer 302, thereby reducing the lattice defects phenomenon.

Figure 5:
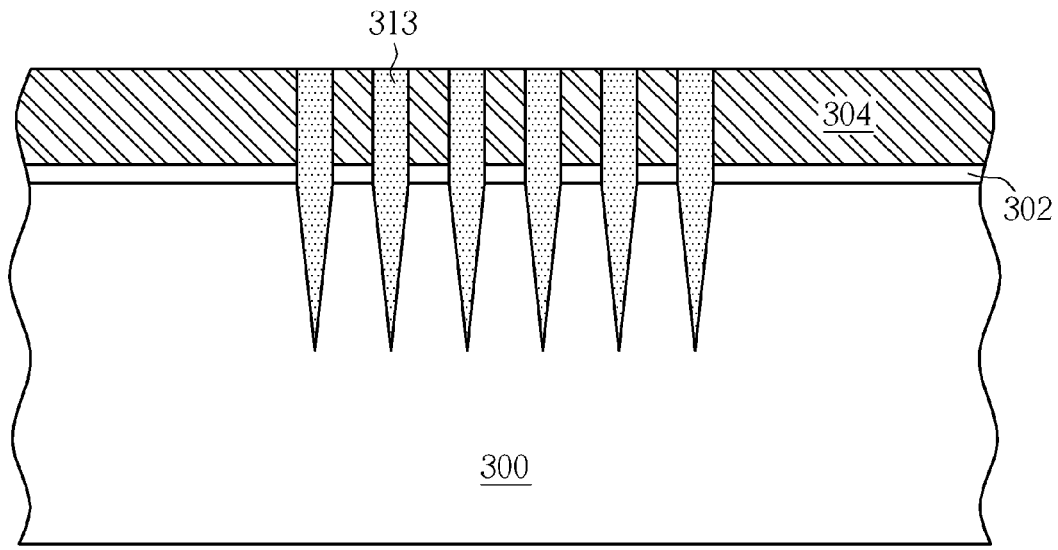

As shown in FIG. 5, a planarization step such as a chemical mechanical polishing (CMP) process is performed to remove the semiconductor layer 312 above the mask layer 304, making the semiconductor layer 312 being level with the mask layer 304. In this step, the semiconductor layer 312 thus becomes a plurality of fin structures 313. Each fin structure 313 is substantially parallel to each other and is disposed in the first trench 310. Each fin structure 313 protrudes from the substrate 300 and is level with the mask layer 304.

Figure 6:
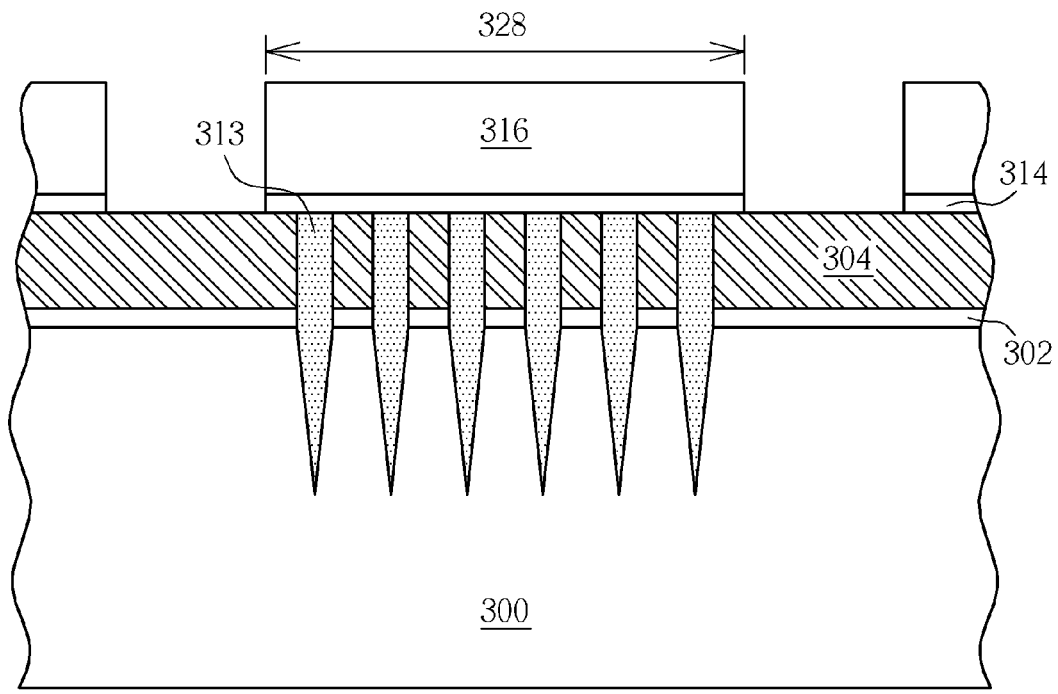
Figure 7:
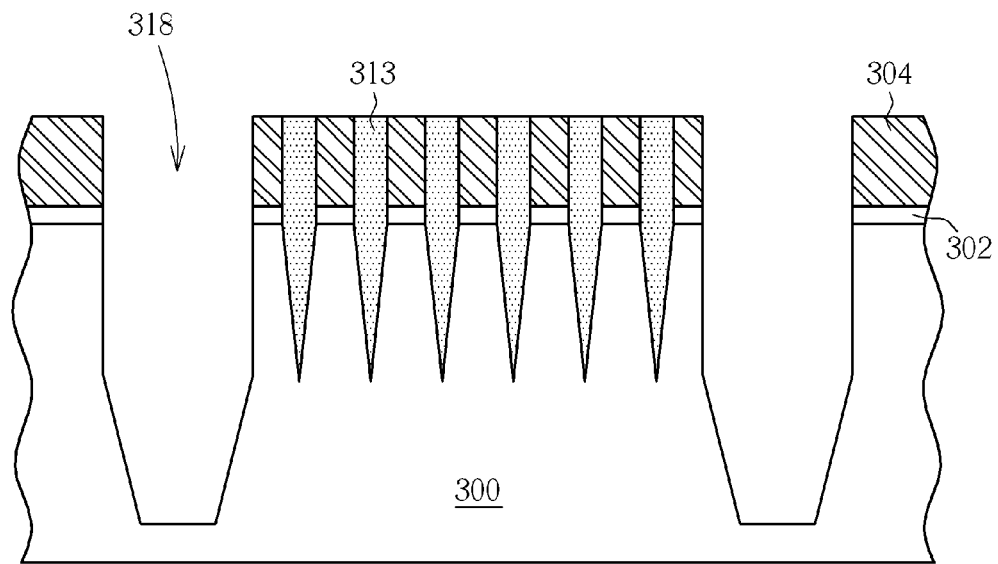

As shown in FIG. 6, a patterned BARC 314 and a patterned photoresist layer 316 are formed on the mask layer 304. An active region 328 and the position of the STI formed in the subsequent steps are therefore defined. The fin structures 313 are located in the active region 328. Then, as shown in FIG. 7, by using the patterned photoresist layer as a mask, an etching process is performed to remove the mask layer 304, the material layer 302, and the substrate 300 not covered by the patterned photoresist layer 316, thereby forming a plurality of second trenches 318 in the substrate. The depth of the second trench 318 is greater than that of the first trench 310. In one embodiment, the depth of the second trench 318 is substantially between 2000 A and 3000 A. Then, the patterned photoresist layer 316 and the patterned BARC 314 are removed.

Figure 8:
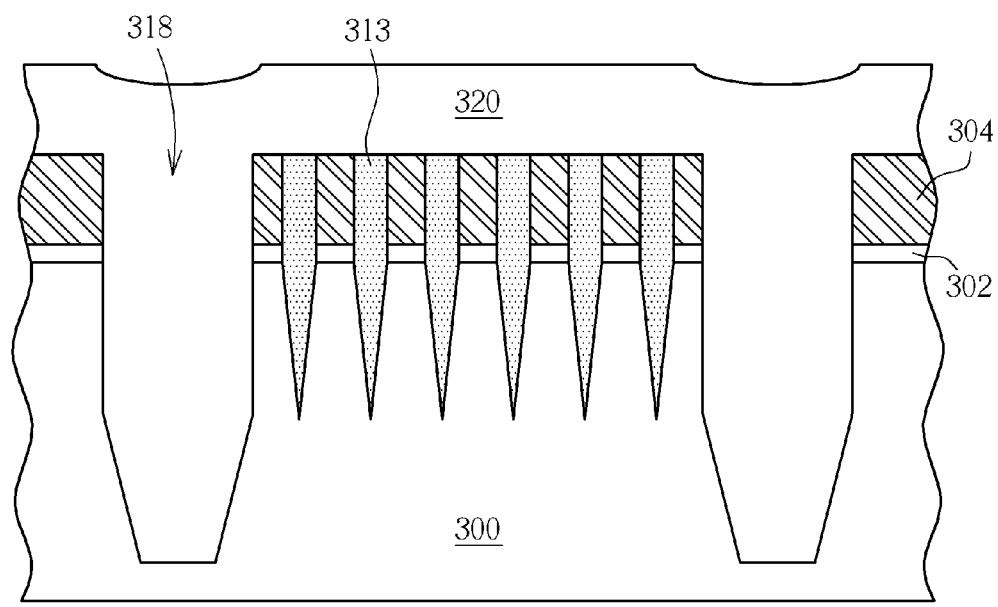
Figure 9:
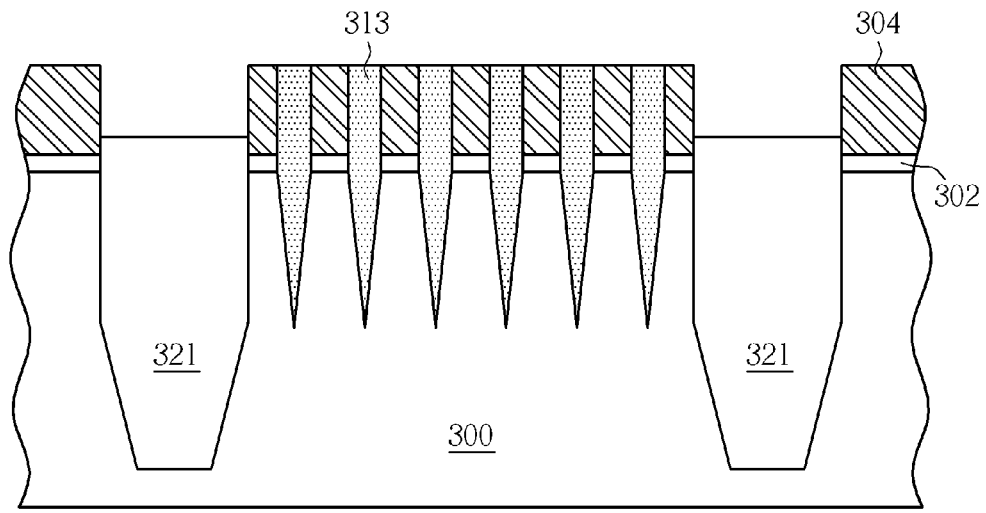

As shown in FIG. 8, an insulation layer 320 is formed on the substrate 300 to completely fill the second trench 318. The method of forming the insulation layer 320 may include a deposition process such as PECVD. The insulation layer 320 may be a SiO2 layer. Then, as shown in FIG. 9, a planarization process is performed to remove the insulation layer 320 above the mask layer 304. An etching back process is carried out to remove a part of the insulation layer 320 in the second trench 318. Thereafter, the insulation layer 320 is slightly higher than the material layer 302 and forms a plurality of shallow trench isolations 321. It is noted that, the previous embodiment provides forming the fin structure 313 (FIG. 1 to FIG. 4) and then forming the STI 321 (FIG. 5 to FIG. 8). In another embodiment, the STI 321 can be formed before forming the fin structure 313.

Figure 10:
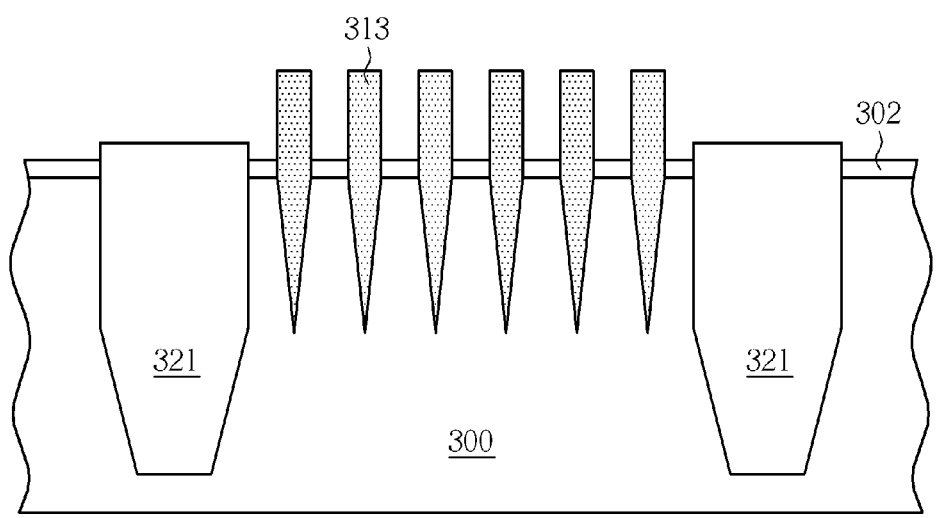

As shown in FIG. 10, an etching process is performed to remove the mask layer 304. In one embodiment, when the mask layer 304 is SiN, it can be removed by using hot phosphoric acid. In another embodiment, a strained silicon layer (not shown) can further be formed on the sidewall and/or the top surface of the fin structure 313. In another embodiment, when the fin structure 313 includes a relaxed SiGe layer, a second SiGe layer (not shown) can be formed on the fin structure 313, wherein a concentration of Ge in the second SiGe layer is greater than that of the fin structure 313.

Figure 11:
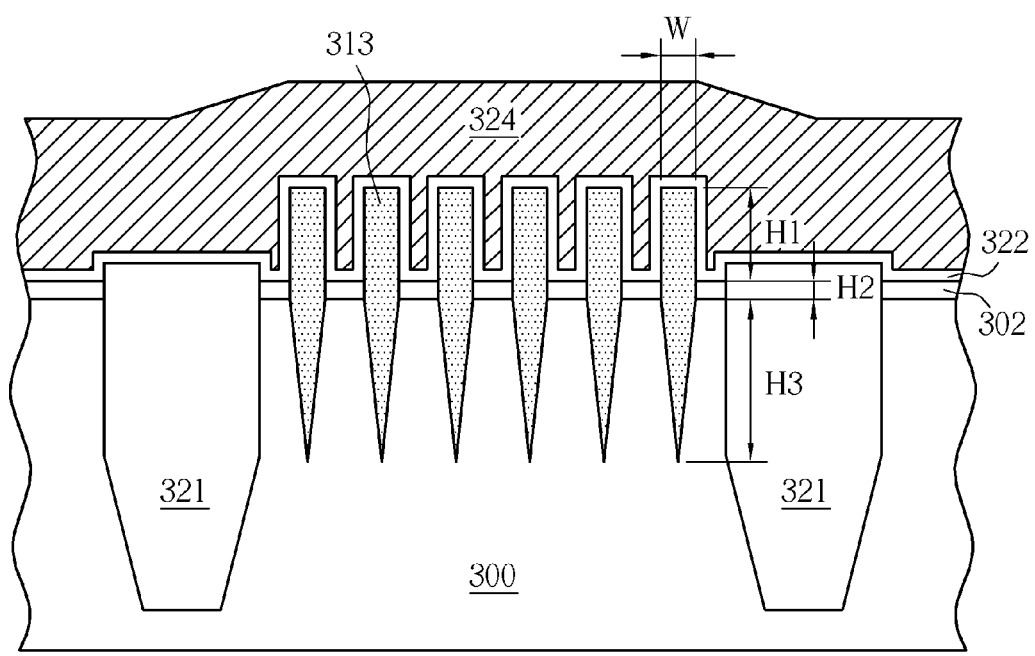

Finally, as shown in FIG. 11, a gate dielectric layer 322 is formed to cover the fin structure 313. The gate dielectric layer 322 can be, for example, a silicon layer or a high-k dielectric layer. Then, a gate layer 324 can be formed on the gate dielectric layer 322. The gate layer 324 can include a variety of conductive materials, such as polysilicon or metal. Next, after patterning the gate layer 324 to form the required gate structure, an ion implantation process is carried out to form the source region 313a and the drain region 313b of the fin structure 313 as shown in FIG. 12. Through the above steps, the Fin-FET 326 structure in FIG. 12 can be provided. In another embodiment, an inter-layer dielectric (ILD) layer (not shown) can be further formed on the Fin-FET 326, and a plurality of contact holes (not shown) are formed therein to provide appropriate input/output pathway toward outer circuits.

It is appreciated that the aforementioned embodiment depicts a "gate first process." However, the present invention can also be applicable to a "gate last process." For example, the gate layer 324 can be used as a sacrifice gate which can be removed after forming the ILD layer, Thereafter, a low-resistive gate such as a metal gate can be formed to serve as a real gate. Consequently, a "gate-last process" can be carried out.

It is noted that, the width W, the thickness H1, the thickness H2 and the thickness H3 of the fin structure 313 can be adjusted by controlling the parameters in the fabrication process described above. For example, the width W and the thickness H3 can be determined by the first trench 310 in FIG. 3. The thickness H1 and the thickness H2 can be determined by the thickness of mask layer 304 and the thickness of the material layer 302 respectively. By adjusting the parameters to determine the ratio of the width W and thickness H1, different types of non-planar transistors, such as FIN-FET (if H1>2 W), trigate (if H1 is about W) or segment-FET (if H1 is about 0.5 W), can be provided according to the design of products. In addition, by using the selective epitaxial growth process to form the fin structure, in combination of the tapered sidewall and the CTA process, the quality of the fin structure can be enhanced, so the yields of the products can be improved. Moreover, in comparison with traditional Fin-FET which is mostly formed on SOI substrate, the forming method can be applicable to silicon substrate, thereby increasing the flexibility of forming methods.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fin field effect transistor (Fin-FET), comprising:
   a substrate;
   a fin structure embedded in the substrate and protruding above the substrate, wherein the fin structure comprises a tapered structure shrinking towards the substrate and the tapered structure has an angle θ less than 30 degrees;
   a gate dielectric layer disposed on a surface of the fin structure; and
   a gate layer disposed on the gate dielectric layer.

2. The Fin-FET according to claim 1, wherein the fin structure comprises a silicon layer, a germanium layer, a silicon-germanium layer or the combination thereof.

3. The Fin-FET according to claim 1, further comprising a strained silicon layer disposed between the fin structure and the gate dielectric layer.

4. The Fin-FET according to claim 1, wherein the fin structure comprises a relaxed SiGe layer, and the Fin-FET further comprises a second SiGe layer disposed between the fin structure and the gate dielectric layer, wherein a concentration of Ge in the second SiGe layer is greater than that in the fin structure.

5. The Fin-FET according to claim 1, wherein the fin structure comprises a relaxed SiGe layer, and the Fin-FET further comprises a strained silicon layer disposed on a sidewall of the fin structure.

* * * * *